United States Patent [19]
Fiedler et al.

[11] Patent Number: 4,776,277
[45] Date of Patent: Oct. 11, 1988

[54] METHOD AND ARRANGEMENT FOR IMPLEMENTING AN OPERATIONAL TEST ON ELECTRICALLY-ACTUATABLE IGNITION CIRCUITS FOR AMMUNITION

[75] Inventors: Kurt Fiedler, Nuremberg; Bernhard Kratz, Wendelstein; Rudolf Harbrecht, Nuremberg, all of Fed. Rep. of Germany

[73] Assignee: Diehl GmbH & Co., Nuremberg, Fed. Rep. of Germany

[21] Appl. No.: 72,427

[22] Filed: Jul. 13, 1987

[30] Foreign Application Priority Data

Jul. 25, 1986 [DE] Fed. Rep. of Germany ........ 3625302

[51] Int. Cl.$^4$ ............................................. F42C 21/00
[52] U.S. Cl. .................................... 102/293; 73/167;
. 102/200; 102/206
[58] Field of Search .................... 102/200, 206, 293; 73/167

[56] References Cited

U.S. PATENT DOCUMENTS 4,280,355 7/1981 Donnally et al. ...................... 73/167
4,685,330 8/1987 Ford ..................................... 102/293

FOREIGN PATENT DOCUMENTS 82445 6/1983 European Pat. Off. .
2824203 12/1979 Fed. Rep. of Germany .
3137198 4/1983 Fed. Rep. of Germany .
3317376 11/1984 Fed. Rep. of Germany .

OTHER PUBLICATIONS

Flume, Wolfgang; "MW-1-the multipurpose weapon system"; Miltech; vol. 2/85; pp. 64, 70/72.

Primary Examiner—Charles T. Jordan
Attorney, Agent, or Firm—Scully, Scott, Murphy & Presser

[57] ABSTRACT

A method for implementing an operational or functioning test on electrically-actuatable ignition or detonation-triggering circuits for ammunition, wherein the circuits are arranged on board the ammunition. Moreover, also disclosed is an arrangement for the implementation of an operational test of electrically-actuatable ignition or detonation-triggering circuits for the ammunition, wherein the circuits are arranged on board the ammunition.

10 Claims, 3 Drawing Sheets

METHOD AND ARRANGEMENT FOR IMPLEMENTING AN OPERATIONAL TEST ON ELECTRICALLY-ACTUATABLE IGNITION CIRCUITS FOR AMMUNITION

BACKGROUND OF THE INVENTION

1. Field of the Invention

The present invention relates to a method for implementing an operational or functioning test on electrically-actuatable ignition or detonation-triggering circuits for ammunition, wherein the circuits are arranged on board the ammunition. Moreover, the invention relates to an arrangement for the implementation of an operational test of electrically-actuatable ignition or detonation-triggering circuits for the ammunition, wherein the circuits are arranged on board the ammunition.

2. Discussion of the Prior Art

Conceivable as an area of utilization for the invention is, in particular, the test firing and acceptance-firing for ammunition, which are fired in the type of spread or sprayed ammunition from an airborne launching container, such as the so-called runway cratering bomb (STABO) for the weapon system MW-1 (as disclosed in the article by Wolfgang Fume "MW-1—the multi-purpose weapon system", published in MILTECH Volume 2/85, pages 64, 70/72). In ammunition of that type, certain pyrotechnic power-generating elements are activated in a predetermined time sequence which is predetermined by the circuitry technology, so as to be able to generate certain mechanical ations, such as the outward extension of a distance or range-impact sensor; for instance, as is elucidated in greater detail in the disclosure of German Pat. No. 31 37 198. An electronic triggering origination sequence control circuit for such triggering circuits is described in more extensive detail in German Laid-Open Patent Appln. No. 33 17 376.

The problem which is encountered during the transition stage from development into manufacture, and in the acceptance of manufacturing tolerances is, that such ammunition, when it is fired under realistic or actual conditions and thereafter recovered, in the case of malfunctions of individual ignition or triggering circuits and thereby of the ammunition in its entirety, no longer allows for the drawing of any conclusions over the actual operational occurrences, encountered within the ammunition and as a result does not allow for any interpretation of eventual or future possible causes of malfunctions.

In view of the foregoing, in actual practice, advantage is taken of the currently available measures of that type in that, instead of the warhead or combat charge in the ammunition, there are built in circuits for the obtaining of test data and data storage, in order to be able to subsequently reconstruct the operating cycles of important electronic operational elements. This, however, necessitates the implementation of functionally significant modifications in the ammunition itself, so as to provide only conclusions within an extremely narrow scope over the behavior of the ammunition in the case of the latter being provided with its original equipment. Moreover, under certain circumstances, there must be met special measures for the safe recovery of the data storage, which adversely influence the ballistic behavior of the ammunition. The last-mentioned is also applicable when instead of the data storage on board of the ammunition, there is installed a telemetering-transmitting station, so as to be able to observe, on a real-time basis, the behavior of the ammunition during its period of flight. However, the space available within the ammunition is frequently inadequate to allow for a complete determination of test data and for telemetering.

A realistic operational test from the airborne passage is further encumbered by the disadvantage of complex preparations needed for the experimentation, and the high costs of the flight with lengthy searching actions required for the recovery of the dispersed ammunition. Finally, the flight safety prescriptions and the time which is required form restrictions with respect to the open acceptance over the entire range of the operational temperatures which must be proven; in effect, with regard to the possibilities, that certain loose parts or tolerances must be set after cooling down or after heating up, to extreme operational limiting temperatures, whereas during the time requirement for the air circulation there is again encountered a correlation with the environmental or surroundings temperature, as a result of which it is not possible to ensure the employment thereof under a defined extreme temperature.

SUMMARY OF THE INVENTION

In recognition of these conditions, it is an object of the present invention that, through the utilization of simple apparatus, there can be created testing capabilities which open an essentially enhanced and repeatable inspection capabilities for the analysis of the functions of that type of ammunition.

In accordance with the foregoing, the firing of the ammunition which is armed with all of the important operative components of the original equipment equipping; upon occasion immediately after removal from an air-conditioned cabinet, can take place from an original launch tube, which is not arranged on an airborne carrier but is stationarily positioned, such that through the inclination or firing angle of the launch tube, there can also be preset different ballistic trajectories and thereby different flight ranges or flight times within wide limits, and which are readily reproduceable. During the passage through this trajectory of flight, there can be tested the operational or functional cycle of the important technological circuitry components, since a tether cable is connected to the ammunition; in effect, electrically connected to the circuitry components which are of interest. Moreover, beginning from the firing, during the entire trajectory there can be interrogated the interesting potentials of operationally important circuitry components, and in a real-time, registered and analyzed in a stationarily arranged measuring apparatus. The thin, flexible tether cable can be deployed in an extended loop along the expected trajectory, so that it does not need to be uncoiled from a supply reel; in effect, exerts only comparatively minor or negligible influence over the ballistic behavior of the ammunition. Functions, which during the test firings and acceptance firings for the ammunition cannot be implemented in the original due to physical or safety reasons; are enabled to be simulated through this tether cable, so that resultingly, the functional or operational cycle of the electrical circuits within the ammunition conforms as closely as possible to the actual conditions of the weapon system in the utilization of the ammunition. Thus, in particular, through the intermediary of the tether cable, in dependence upon the functioning of the launch tube muzzle-safety switch, a charging current for the capacitors of the triggering or ignition circuit can be fed into the ammunition, when a windmill or impeller-generator is not available for the environmentally-dependent output of electrical power for the readying of the ignition circuits during test and acceptance firings. Through the tether cable there is preferably interrogated, in any case, the sequence and the respective timewise attitude of the voltage fluctuations with regard to this supply line, which occur as a result of the sequence in the actuations of the individual ignition or triggering circuits. Without any considerable additional demands; for example, in addition thereto, there can be interrogated and registered the potentials between an ignition or triggering capacitor and a triggering element (electrical detonator) of the individual ignition circuits, so as not to only test the actuation, but also the response of the detonators in a real-time relationship respecting each other, and thereby to be able to draw conclusions on the basis of any apparent malfunctions.

BRIEF DESCRIPTION OF THE DRAWINGS

Further alternatives and modifications, as well as further features and advantages of the invention, can now be readily ascertained by reference to the following detailed description of an exemplary embodiment thereof, taken in conjunction with the accompanying drawings; in which.

DETAILED DESCRIPTION

Figure 1:
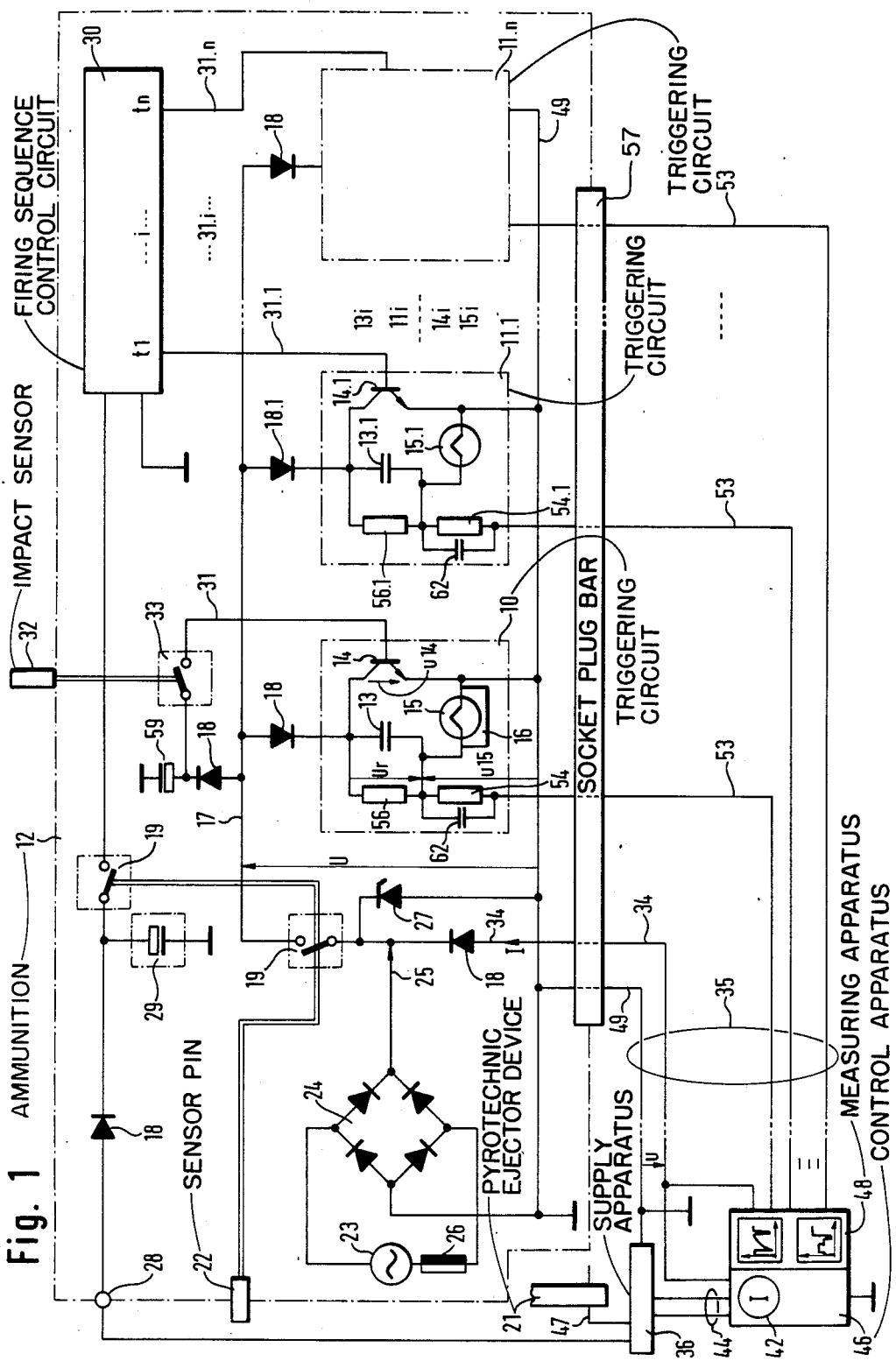
FIG. 1 illustrates a block circuit diagram of different triggering or ignition circuits which are actuated from an ignition or firing order circuit, including testing and power supply arrangements connected thereto through the intermediary of a cable.

The circuit arrangement pursuant to FIG. 1, which is illustrated in a partly simplified manner through a block circuit diagram, discloses different ignition or detonating circuits 10, 11i for an article of ammunition 12, by means of which there can be presently discharged the electrical energy of a charged ignition or detonating capacitance or capacitor 13 at a closed switching section 14 through an electrical detonating element 15 (preferably a bridging detonator) for the triggering of an active charge 16 (for instance, a transmitting charge, not shown in the drawings), such as, for example, to ignite pyrotechnic power elements for implementing setting and other kinds of control manipulations, or triggering the active charge 16 of a warhead.

Figure 4:
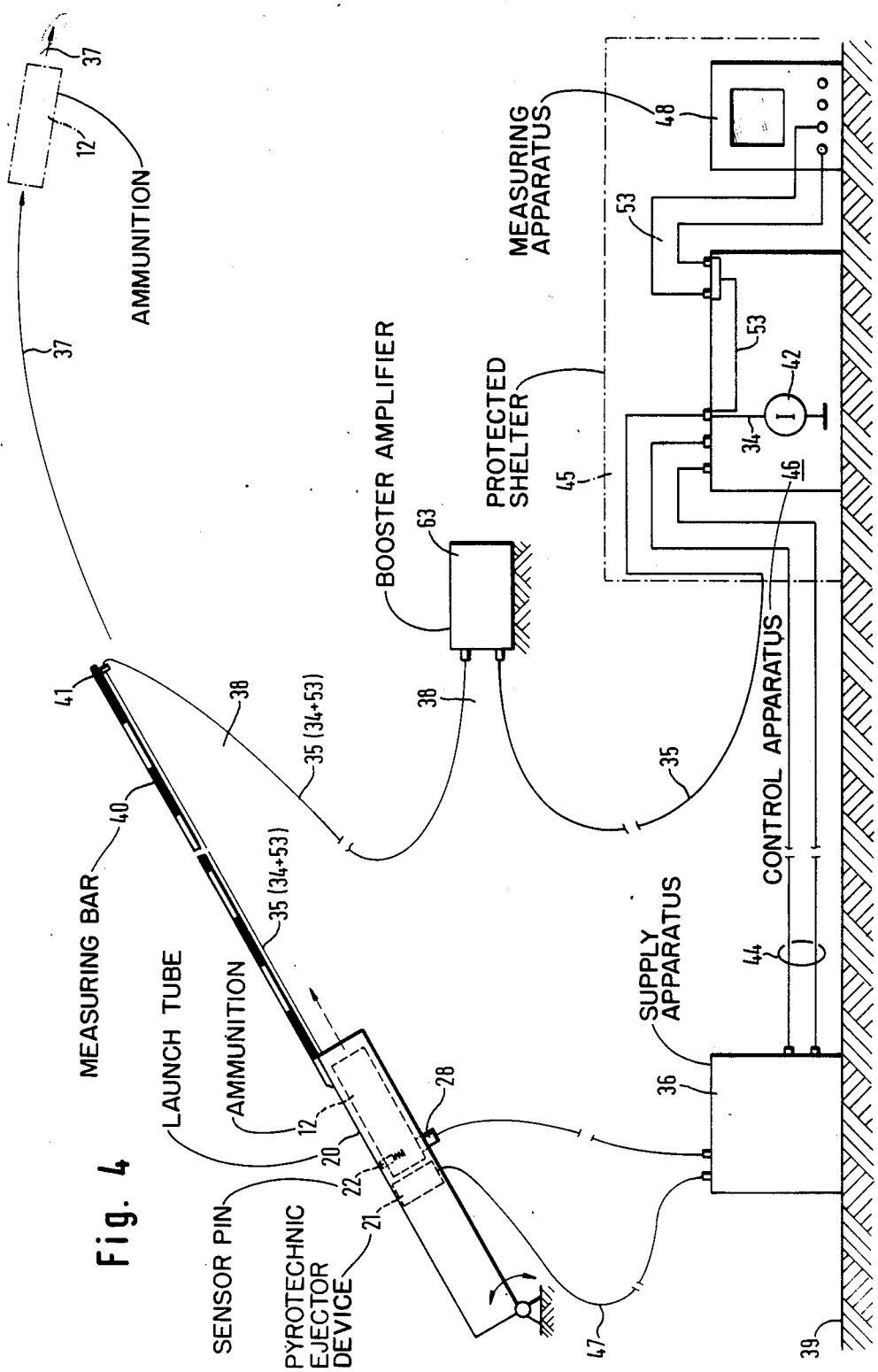
FIG. 4 illustrates, generally schematically, the apparative system construction of a power supply and testing arrangement pursuant to FIG. 1.

The ignition or triggering capacitors 13 of each one of the ignition circuits 10, 11i are charged up with a limited charging current 25 at the beginning of the operation of the ammunition 12 through a power supply line 17, feedback-blocking diodes 18 and the triggering element 15, when a safety switch 19 is closed in series with the power supply line 17. The safety switch 19 is closed, for ammunition 12 which is to be fired from a weapon barrel or launch tube 20 (FIG. 4) through a pyrotechnic ejector device 21, when a sensor pin 22 which projects beyond the periphery of the ammunition 12, and which has up to that time been supported under spring-tension against the inner periphery of the launch tube 20, has traveled outwardly into its final position, inasmuch as the ammunition 12 has exited from the launch tube 20.

Figure 2:
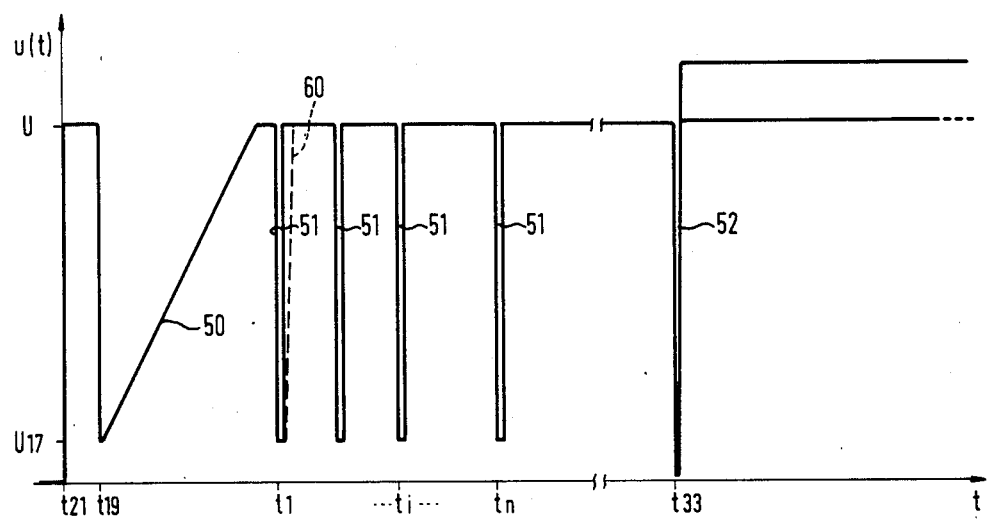
FIG. 2 illustrates a graph of a typical voltage cycle acting on the ignition or triggering control or test line.

For implementing the readying of the charging or power energy for the charging up of the triggering capacitors 13, the ammunition 12 is equipped with an environmentally-dependent operating generator 23 upon exiting the launch tube or weapon barrel 20, such as an impeller-generator which is driven by the oncoming airflow from the surroundings, which supplies the line 17 with direct current 25 through the safety switch 19 which is closed during free-flight (in effect, after leaving the tube 0) and to a rectifier-bridge circuit 24. The high, complex internal impedance 26 causes the generator 23 to behave as a constant-current source. As a result thereof, the charging voltage u at the triggering capacitors 13 rises approximate linearly over the time period t (FIG. 2), until there has been reached a rated voltage U, which can be unitarily predetermined by a limiting circuit 27; for example, in the form of a zener diode, for all triggering circuits 10, 11.

In the launch tube 20 there is further charged up an electrical energy storage or accumulator 29 for the operation of a triggering or firing sequence control circuit 30; for example, across a coupling location 28, such as a sliding loop contact or a non-contacting transmission installation, which energy storage, in accordance with a pregiven operating cycle program, will at subsequent points in time ti (i=1-n), sequentially actuate the triggering circuits 11i through switch control lines 31i, in order to activate the associated switching sections 14i.

As a result thereof, the associated triggering capacitors 13i are discharged, as described, through the triggering elements 15i, in order to implement certain mechanical operations in this sequence; for instance, such as the release of a mechanical securing device, the discharge of a braking parachute and/or the outward displacement of a range or distance-impact sensor 32. When the ammunition 12 with its impact sensor 32 strike against a target object (not shown), an electrical impact contact 33 is closed, so as to, for example, from the energy storage 19, but because of safety reasons, preferably from another (supplied with energy through the line 17) charging storage 59, actuate the triggering or detonating circuit 10 which is associated with the active charge 16 of the warhead; in effect, cause the ammunition 12 to be brought to detonation.

During the evaluative or acceptance firing from a stationarily installed launch tube 20, and for the remainder, with operationally complete ammunition 12, due to the ballistic conditions which deviate from the real utilization with respect to the trajectory and flying time, the (impeller) generator 23 is not functional, or is even switched off or disassembled. For the supply of the capacitor charging line 17, the safety switch 19 is connected through a test and supply branch line 34 of a tether cable 35 to a stationary current source 42. A stationary supply apparatus 36 serves for the supply of the coupling location 28 and for the actuation of the ejector device 21.

In order that the ballistic trajectory 37 (FIG. 4) be disturbed as little as possible through the braking force of the cable 35 which is to be dragged along by the ammunition 12, the tether cable 35 is expediently positioned on the ground 39 as a cable loop 38 which extends for about one-half the expected distance of flight. A measuring bar 40 which, as required, projects axially-parallel on the test launch tube 20 (for the interpretation of high-speed recordings at the muzzle of the launch tube for the ammunition 12), can concurrently serve as a cable guide with a releasable fastening 41 for the cable loop 38 which is hingedly connected hereto.

At the beginning of the operation, the power supply apparatus 36, which is connected through a control and supply line 44, to a control apparatus 46 which is located offset towards one side in a protected shelter 45, is placed from there into operation so as to supply the coupling location 28 with power and to trigger the ejector device 21 through a starting line 47. Generally concurrently therewith is the current source 42 connected with to the supply branch line 34. While initially, as long as the ammunition 12 is still contained in the launch tube, the safety switch 19 is not yet closed, resulting therefrom at the point in time shown in FIG. 2 as the timepoint t21, is that the no-load voltage which is limited to the rated voltage U is indicated on the registering measuring apparatus 28 which is connected to the power supply branch line 34.

As soon as the ammunition 12 has exited from the launch tube 20, the safety switch 19 closes and the voltage U breaks down to a residual voltage value U17 which is dependent upon the line losses and the blocking diodes 18. From this, there results the charging of the parallel-connected triggering capacitors 13 which are uncoupled through the diodes 18, at a direct current infeed with a rise in the curve 50 of the charging voltage u on the supply line 17 up to the limited rated voltage U, which rise is substantially linear over the course of time.

At timepoints t1 there is actuated the switching section 14.1 of the first triggering circuit 11.1 (whose internal circuitry corresponds to that of the triggering circuit 10 in FIG. 1) from the triggering order control circuit 30. In consequence thereof, the triggering capacitor 13 is now rapidly discharged through the switching section 14.1 and the low-ohmic triggering element 15.1. This represents itself in the voltage plot according to FIG. 2 as a steep voltage drop or breakdown 51 to about the value U17, inasmuch as the supply line 17 is now connected to ground 49 across the thus low-ohmic switching section 14.1.

When the circuit 30 thereafter terminates the control pulse on the switching line 31$i$, in effect, the switching section 14.1 acts again high-ohmic, the potential on the supply branch line 34 then again jumps back up to the rated voltage U, when a recharging of the similarly actuated triggering capacitor 13.1 no longer takes place because of the now interrupted current circuit across the triggered detonating element 15. However, should there still remain an ohmic connection, there is obtained a recharging of the capacitor, and thereby a somewhat less steep jump back 60, as is qualitatively indicated in FIG. 2 through the phantom-lines. From this voltage sequence u(t) which is observed registered and analyzed at the measuring apparatus 48, in dependence upon the firing of the ammunition 12 there can be read off as to whether after the points in time to 19 in the exit from the tube, there takes place a regular charging of all triggering capacitance or capacitor circuits (represented by the slope of the curve 50 during the subsequent rise of the voltage u up to the rated value U), and as to whether thereafter, at the preprogrammed points in time ti there is encountered the orderly activation of the individual triggering circuits 11$i$; in effect, the rendering conductive of their switching sections 14$i$ an the functioning of their triggering elements 15$i$.

When the ammunition strikes the ground 39, then by means of the sensor 32, the impact contact 33 is closed, and consequently, from the storage 59 and through the triggering circuit 10, there is actuated the active charge 16; with the result, that the ammunition 12 (and thereby also the connection from the supply line 34) is destroyed. The hereby encountered internal short-circuit allows, at the point in time t32, the voltage u to almost completely attenuate for a short period, whereupon because of the torn apart connection to the ammunition 12, there occurs at the measuring apparatus 48 a back jump 52 to the voltage U, which is further obtained herein from the voltage source 42.

In FIG. 1 there is provided that, in addition to the supply line 34 (for the charging up of the triggering capacitors 13 as well as for the registration of the curves 50, 51, 60 and 52, in effect, for the monitoring of the charging and the ignition control or the triggering capacitors 13), additional test branch lines 53 are connected through the tether cable 35 for the triggering sequences in the triggering circuits 10, 11.1 to the measuring apparatus 48. These respectively interrogate, through a very high-ohmic uncoupling impedance 54, the cycle of the potential u15 (as shown in FIG. 3) between the triggering capacitor 13 and the trigger or detonating element 15, so as to be able to monitor from the timewise representation (FIG. 3) for the respective triggering circuit 10 or 11$i$, as to whether the activation of the switching section 14$i$ from the triggering order control circuit 30 will then also lead to a response at the desirable time relationship due to the discharge of the associated triggering capacitor 13$i$; in effect, as a rule to the destruction of the trigger element 15.

The capacitance charging current encountered in each triggering circuit 10, 11$i$ beginning with the point in time t19; in effect, commencing with leaving the launch tube, across the initially still electrically-conductive bridge of the trigger element 15, leads in every circuit 10, 11$i$, at a constant current supply, to a widespread, flat cycle 55 for the potential u15. As is fully represented for a simplification of the illustration in FIG. 3 for only the curve plot associated with the timepoint t1, this cycle 55 attenuates at a charged-up triggering capacitor 13 down to the potential of the ground line 49. At the timepoint ti, the charged capacitor 13 is connected through the switching section 14 in parallel with the trigger element 15, as a result of which the potential u15 jumps to almost the negative value of the rated voltage U and then, in accordance with the discharge through the trigger element 15, evidences an exponentially attenuating cycle 58, until the trigger element 15 responds; which can be recognized from plasma oscillations 61. When, due to the foregoing, the electrical connection is hereby short-circuited, the potential u15 then jumps to ground, which in the enlarged sectional detail of FIG. 3 is illustrated through the line vertical rise shown in phantom-lines. However, when the addressed trigger element 15 becomes high-ohmic; in essence, the capacitor 13 can hereby no longer be further discharged, then the condition of the potential reach thereby is maintained, until (shown in solid lines in the enlarged detail of FIG. 3) the actuation of the switching section 14 is terminated by the circuit 30. The potential u15, under consideration of a protective bypass or shunt impedance 56 which is connected in parallel with the capacitor 13, then jumps to the rated voltage +U, until at the impact timepoint t33, there terminates the supplying of power to the supply line 17; in effect, the collective potentials u15i break down at the measuring apparatus 48.

Figure 3:
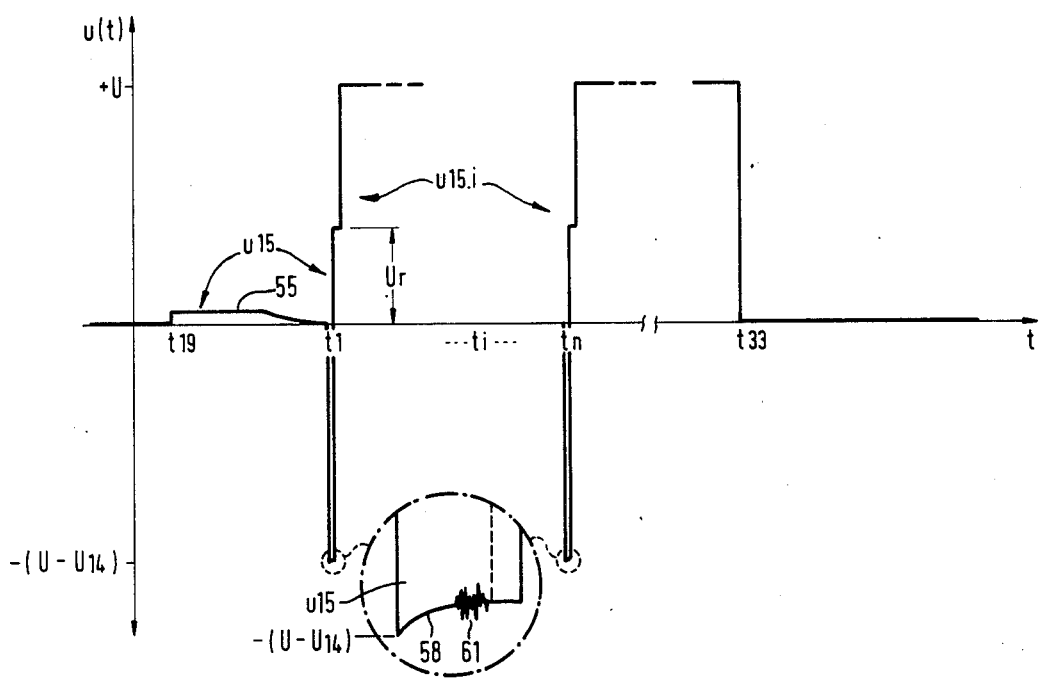
FIG. 3 illustrates a graph representative of typical voltage cycles acting on the ignition cycle-test branch lines.

From the registered time plots of the individual potentials u15i (which in contrast with the simplified representation in FIG. 3 are expediently not plotted on a common time axis, but rather over parallel-extending separate time axes), there can be subsequently investigated the correct conductivity and response behavior of the trigger elements 15, and thereby of the individual triggering circuits 10, 11.1 of a real fired article of ammunition 12.

The high conductor capacitance of the test branch lines 53 of the tether cable 35 which are connected intermediate the triggering capacitor 13 and the trigger or detonator element 15 can have the the result that, upon the activation of the switching element 14, there will not be encountered the steep capacitance discharge current which is sought for the functioning of the trigger element 15, inasmuch as, initially, the line capacitances arranged in parallel with the trigger elements 15 will lead to charging sequences. As a foresight, in view thereof, in FIG. 1 it has been considered that the high-ohmic shunt or uncoupling impedance for the connection of the test branch lines 53 should be by-passed a compensating capacitance 62. However, in order to still allow for a lengthy cable connection by means of the loop 38; in essence, to facilitate a widely extending trajectory 37, pursuant to FIG. 4 a stationary booster amplifier 63 is preferably connected into the deployed tether cable 35. Thereby, the line capacitance which is to be compensated for is reduced to the length of the line from the ammunition 12 to the booster amplifier 63.

In order to simplify the manipulation or handling, expediently at least the ammunition 12 which is provided for test or acceptace purposes is equipped at its end surface for the connection of the tether cable 35 with a multi-pole socket plug bar 57, which towards the side facing the ammunition, is wired to the ground line 49 and to the power supply branch line 34, as well as, upon occasion, to the uncoupling impedances 54 for the test branch lines 53.

What is claimed is:

1. In a method for implementing an operational test on electrically-actuatable ammunition triggering circuits onboard the ammunition, the improvement comprising in firing the ammunition from a stationary launch tube; forming an electrical connection through a tether cable between the ammunition and a stationarily arranged measuring and registering apparatus for test data, the tether cable which is taken along by the ammunition being electrically connected with charging and-/or discharging circuits o triggering capacitors; observing and registering the functions of said circuits pursuant to the extent timely time-staggered encounted fluctuations in the potential; and evaluating in the mutual time cycles, the internal functional cycle in the ammunition.

2. In an arrangement for implementing an operational test on electrically-actuatable ammunition triggering circuits onboard of the ammunition, the improvement comprising in that the triggering circuits are connected through a tether cable with a stationary registering and measuring apparatus.

3. An arrangement as claimed in claim 2, wherein said tether cable includes a power supply branch line for the charging of the triggering circuits from a source of current; and means in the registering and measuring apparatus for evaluating the voltage cycle in the power supply branch line.

4. An arrangement as claimed in claim 2 or 3, wherein said tether cable includes test lines which deliver electrical potentials through uncoupling impedances from trigger elements of the triggering circuits to the registering and measuring apparatus.

5. An arrangement as claimed in claim 2, wherein the tether cable is deployed as a cable loop extending along about one-half of the expected ballistic trajectory of the ammunition.

6. An arrangement as claimed in claim 2, wherein a stationary launch tube for the ammunition is equipped with a cable guide for the transient support of the tether cable prior to and during the firing of the ammunition from the launch tube.

7. An arrangement as claimed in claim 2, wherein the tether cable is conducted by a multi-pole socket plug bar to the ammunition.

8. An arrangement as claimed in claim 2, wherein, for a stationarily arranged firing launch tube, a supply apparatus for supplying electrical power to the ammunition and for actuation of an ejector is arranged ahead of the firing; and the registering and measuring apparatus and the current source which is connected to the tether cable are arranged in a sideways offset secured shelter.

9. An arrangement as claimed in claim 2, wherein said tether cable is conducted across a booster amplifier stationarily arranged at one side of the registering and measuring apparatus.

10. An arrangement as claimed in claim 4, wherein the uncoupling impedances are shunted over by compensating capacitances.

* * * * *